(12) United States Patent
Nguyen

(10) Patent No.: US 7,808,792 B2
(45) Date of Patent: Oct. 5, 2010

(54) SINGLE FAN TRAY IN A MIDPLANE ARCHITECTURE

(75) Inventor: Tri Luong Nguyen, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 69 days.

(21) Appl. No.: 11/958,492

(22) Filed: Dec. 18, 2007

(65) Prior Publication Data

US 2009/0154098 A1    Jun. 18, 2009

(51) Int. Cl.
*H05K 7/20* (2006.01)
*H05K 5/00* (2006.01)
*G06F 1/20* (2006.01)

(52) U.S. Cl. ............... 361/721; 361/679.48; 361/679.5; 361/679.51; 361/694; 361/720; 361/724; 361/788; 361/796; 454/184

(58) Field of Classification Search ............ 361/679.45, 361/679.48–679.51, 690, 692, 694–695, 361/720–721, 724–727, 788, 796–797, 803, 361/813; 165/80.3; 174/16.1; 312/223.2, 312/236; 454/184
See application file for complete search history.

(56) References Cited

U.S. PATENT DOCUMENTS

| | | | | |
|---|---|---|---|---|
| 4,730,233 A * | 3/1988 | Osterman | .................... | 361/693 |
| 5,289,340 A * | 2/1994 | Yoshifuji | .................... | 361/695 |
| 5,471,099 A * | 11/1995 | Larabell et al. | ............... | 307/53 |
| 6,388,879 B1 * | 5/2002 | Otaguro et al. | ............. | 361/695 |
| 6,768,640 B2 * | 7/2004 | Doblar et al. | ............... | 361/695 |
| 7,016,194 B1 * | 3/2006 | Wong | .......................... | 361/695 |
| 7,050,301 B2 * | 5/2006 | Wong et al. | .................. | 361/695 |
| 7,075,788 B2 * | 7/2006 | Larson et al. | ............... | 361/695 |
| 7,079,387 B2 * | 7/2006 | Brooks et al. | .......... | 361/679.51 |
| 7,111,211 B1 * | 9/2006 | Co et al. | ...................... | 714/718 |
| 7,154,748 B2 * | 12/2006 | Yamada | ...................... | 361/690 |
| 7,164,581 B2 * | 1/2007 | Carullo et al. | ......... | 361/679.48 |
| 7,215,552 B2 * | 5/2007 | Shipley et al. | .............. | 361/721 |
| 7,236,358 B2 * | 6/2007 | Dobbs et al. | ........... | 361/679.31 |
| 7,280,356 B2 * | 10/2007 | Pfahnl et al. | ................. | 361/695 |
| 7,342,789 B2 * | 3/2008 | Hall et al. | .................... | 361/701 |
| 7,486,513 B2 * | 2/2009 | Hall et al. | .................... | 361/699 |
| 7,643,286 B2 * | 1/2010 | Hirai et al. | ............... | 361/679.5 |
| 2002/0018339 A1 * | 2/2002 | Uzuka et al. | ................. | 361/796 |
| 2005/0207134 A1 * | 9/2005 | Belady et al. | ................ | 361/796 |
| 2006/0126292 A1 * | 6/2006 | Pfahnl et al. | ................. | 361/695 |
| 2006/0215363 A1 * | 9/2006 | Shipley et al. | .............. | 361/695 |
| 2008/0068791 A1 * | 3/2008 | Ebermann | ................... | 361/687 |

FOREIGN PATENT DOCUMENTS

WO    WO 2006045367 A1 *    5/2006

* cited by examiner

*Primary Examiner*—Jayprakash N Gandhi
*Assistant Examiner*—Robert J Hoffberg
(74) *Attorney, Agent, or Firm*—Harrity & Harrity, LLP

(57) ABSTRACT

A chassis may include a front section that contains a first electronic circuit board oriented in a first plane, a rear section that contains a second electronic circuit board oriented in a second plane, where the first plane and the second plane are substantially orthogonal, a midplane dividing the front and the rear sections, and a fan tray assembly including a plurality of fans to cool both the first electronic circuit board of the front section and the second electronic circuit board of the rear section.

19 Claims, 6 Drawing Sheets

SINGLE FAN TRAY IN A MIDPLANE ARCHITECTURE

BACKGROUND

Various schemes may be employed for cooling printed circuit boards (PCBs) (e.g., line cards) and other components within a chassis of a device. In instances where a device includes orthogonally oriented PCBs (e.g., horizontal PCBs and vertical PCBs) in a midplane design, there may be at least two fan systems. For example, there may be one fan system to cool the horizontal PCBs and another fan system to cool the vertical PCBs. However, even when employing two fan systems, air flow may not be evenly distributed and may not adequately cool a loaded chassis.

SUMMARY

According to one aspect, a chassis may include a front section that contains a first electronic circuit board oriented in a first plane, a rear section that contains a second electronic circuit board oriented in a second plane, where the first plane and the second plane are substantially orthogonal, a midplane dividing the front and the rear sections, and a fan tray assembly including a plurality of fans to cool both the first electronic circuit board of the front section and the second electronic circuit board of the rear section.

According to another aspect, a method for cooling a device having a midplane design. The method may include directing a first airflow having a first direction to provide a second airflow having a second direction, the second direction being orthogonal to the first direction, cooling, via the second airflow, a first electronic circuit board of the device, the first electronic circuit board being orthogonal to the midplane, redirecting the second airflow to provide a third airflow having a third direction, the third direction being orthogonal to the second direction, redirecting the third airflow to provide a fourth airflow having a fourth direction, the fourth direction being orthogonal to the third direction, and cooling, via the fourth airflow, a second electronic circuit board of the device.

According to still another aspect, a device may include a first array of circuit boards oriented in a first direction in a first compartment of a chassis, a second array of circuit boards oriented in a second direction in a second compartment of the chassis, the second direction being different than the first direction, a midplane connecting one or more circuit boards of the first array of the array of circuit boards with one or more circuit boards of the second array of circuit boards, and a fan tray assembly having a plurality of fans disposed on a plane of the first compartment to cool both the first array of circuit boards and the second array of circuit boards.

According to yet another aspect, a device may include a first plurality of circuit boards oriented in a horizontal direction, a second plurality of circuit boards oriented in a vertical direction, a vertically oriented midplane providing a connection between one or more circuit boards of the first plurality of circuit boards and one or more circuit boards of the second plurality of circuit boards, and a fan system oriented on a plane that is parallel to the second plurality of circuit boards to cool both the first plurality of circuit boards and the second plurality of circuit boards.

According to still another aspect, a device may include a midplane connecting a first circuit board oriented orthogonal to a second circuit board, a chassis, and a cooling mechanism oriented on a plane corresponding to a side of the chassis, where the cooling mechanism pulls air to cool both the first circuit board and the second circuit board.

BRIEF DESCRIPTION OF THE DRAWINGS

The accompanying drawings, which are incorporated in and constitute a part of this specification, illustrate one or more embodiments described herein and, together with the description, explain aspects of the invention. In the drawings.

DETAILED DESCRIPTION

The following detailed description refers to the accompanying drawings. The same reference numbers in different drawings may identify the same or similar elements.

Spatially relative terms, such as "horizontal," "vertical," "front," and "rear" and the like, may be used herein for ease of description to describe an element or the element's relationship to another element as illustrated in the figures. Thus, these terms do not necessarily have only one operational meaning and are not intended to be limiting. The same is true for such terms as "beneath," "below," "lower," "above," "upper," and the like.

For example, it will be understood that the spatially relative terms may be intended to encompass different orientations of the device in use or operation in addition to the orientation depicted in the figures. For example, if the device illustrated in the figures is turned over, elements described as "below" or "beneath" other elements would then be oriented "above" the other elements. Thus, the exemplary term "below" can encompass both an orientation of above and below. The device may be otherwise oriented (rotated 90 degrees or at other orientations) and the spatially relative descriptors used herein should be interpreted accordingly.

The term "connect" and variations thereof (e.g., connected or connection) may be direct or indirect. As used herein, the term "and/or" includes any and all combinations of one or more of the associated list items.

Figure 1:
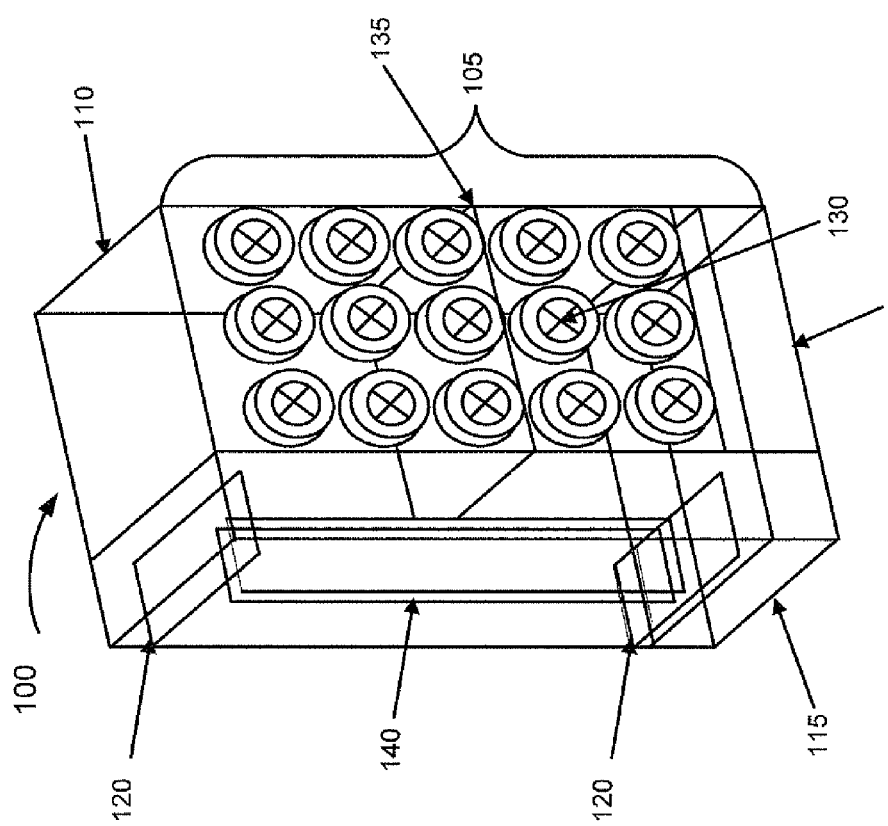
FIG. 1 is a diagram illustrating concepts described herein.

FIG. 1 is a diagram illustrating a device 100 in which concepts described herein may be implemented. As illustrated, device 100 may be, for example, a network device that includes a multi-slot chassis 105 employing a midplane design. Multi-slot chassis 105 may have a generally rectilinear configuration with a front face 110, a rear face 115, and a side face 125. Baffles 120 may be located proximate to rear face 115. Baffles 120 may include a calibrated perforation density to regulate airflow within device 100. A matrix of fans 130 may be located proximate to side face 125 that may be used to cool device 100.

In accordance with this architecture, a single fan system may cool both horizontally oriented PCBs 135 and vertically oriented PCBs 140 of device 100. For example, horizontally oriented PCBs 135 may be proximate to front face 110 and vertically oriented PCBs 140 may be proximate to rear face 115. Additionally, as will be described below, baffles 120 may provide for an even distribution of airflow within device 100.

As a result of the foregoing, a single fan system having baffles to regulate air flow may adequately cool a device and PCBs associated therewith. That is, unlike other implementations that may require a fan system (not illustrated) proximate to rear face 115 to cool PCBs 140 and another fan system proximate to side face 125 to cool PCBs 135, a single fan system 130 may cool PCBs 135 and PCBs 140. The concepts described herein have been partially described in connection to FIG. 1. Accordingly, variations to the above will be described below.

EXEMPLARY DEVICE

Figure 2:
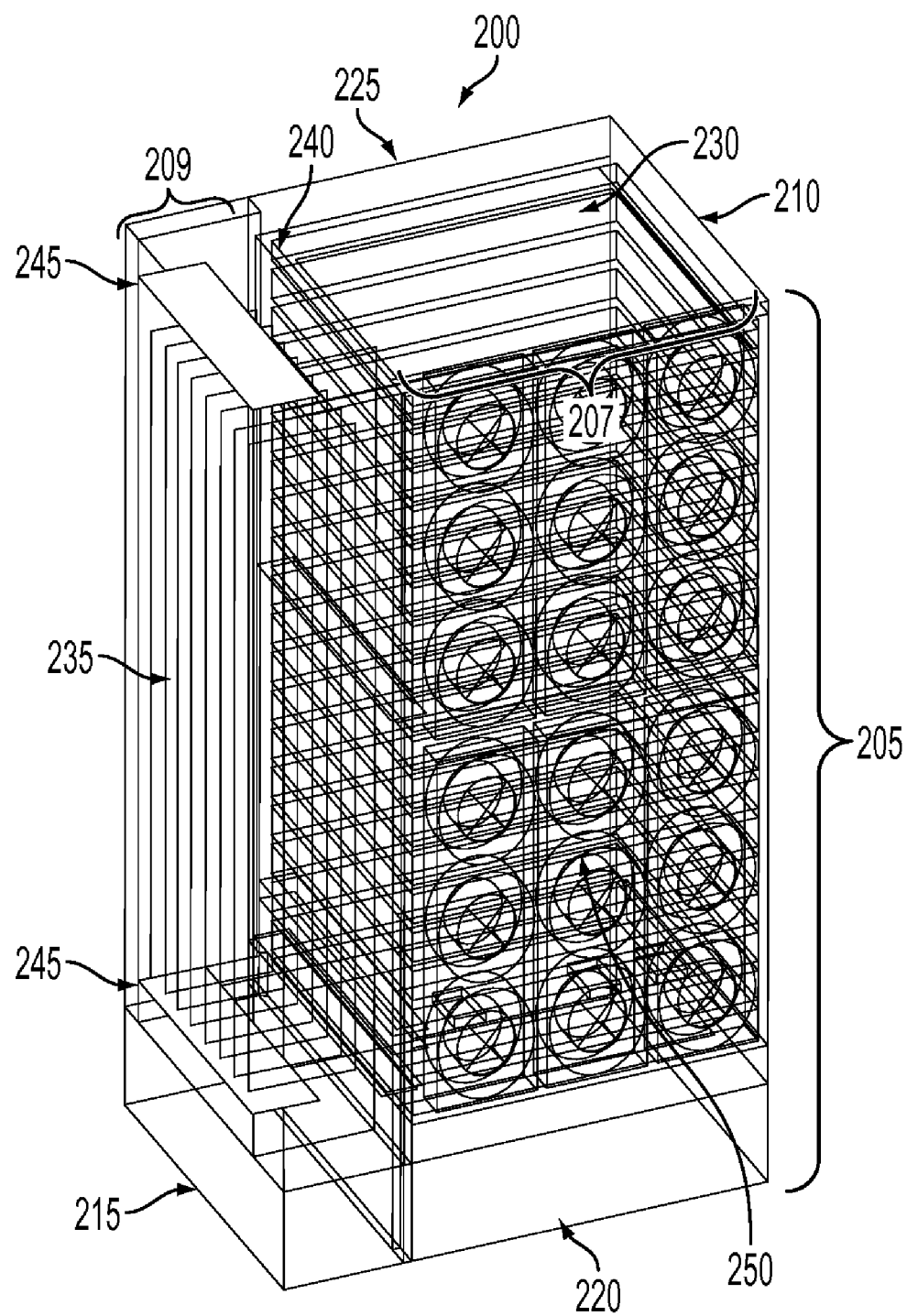
FIG. 2 is a diagram illustrating an exemplary device that may operate according to the concepts described herein.

FIG. 2 is a diagram illustrating an exemplary device 200 that may operate according to the concepts described herein. As illustrated, device 200 may include, among other components, a chassis 205, a front face 210, a rear face 215, a side face 220, a side face 225, PCBs 230, PCBs 235, a midplane 240, baffles 245, and a fan tray assembly 250.

Chassis 205 may be any housing structure to support components of device 200. In one implementation, chassis 205 may have a rectilinear configuration and may be made of, for example, metal, plastic, etc. Chassis 205 may include slots and/or guides (not illustrated) for receiving and housing a plurality of modules, such as PCBs. As will be described below, in one implementation, the slots and/or guides may receive and house PCBs oriented in a horizontal and vertical fashion in accordance with a midplane design. That is, chassis 205 may be divided into a front compartment 207 and a rear compartment 209 by a transverse midplane, such as midplane 240. The size and/or dimensions of chassis 205 may be based on the size and number of PCBs to be housed.

Chassis 205 may include front face 210, rear face 215, side face 220, and side face 225. Proximate to front face 210, device 200 may include PCBs 230 oriented in a horizontal fashion, and proximate to rear face 215, device 200 may include PCBs 235 oriented in a vertical fashion. PCBs 230 and PCBs 235 may each include an array of PCBs, where each PCB is substantially parallel to another PCB within the array.

Midplane 240 may be any connector for mating one or more PCBs of PCBs 230 with one or more other components, such as one or more PCBs of PCBs 235. Midplane 240 may be oriented orthogonal to both PCBs 230 and PCBs 235. Midplane 240 may connect to a power supply (not illustrated). Midplane 240 may permit communication between one or more PCBs 230 and one or more PCBs 235.

Figure 3:
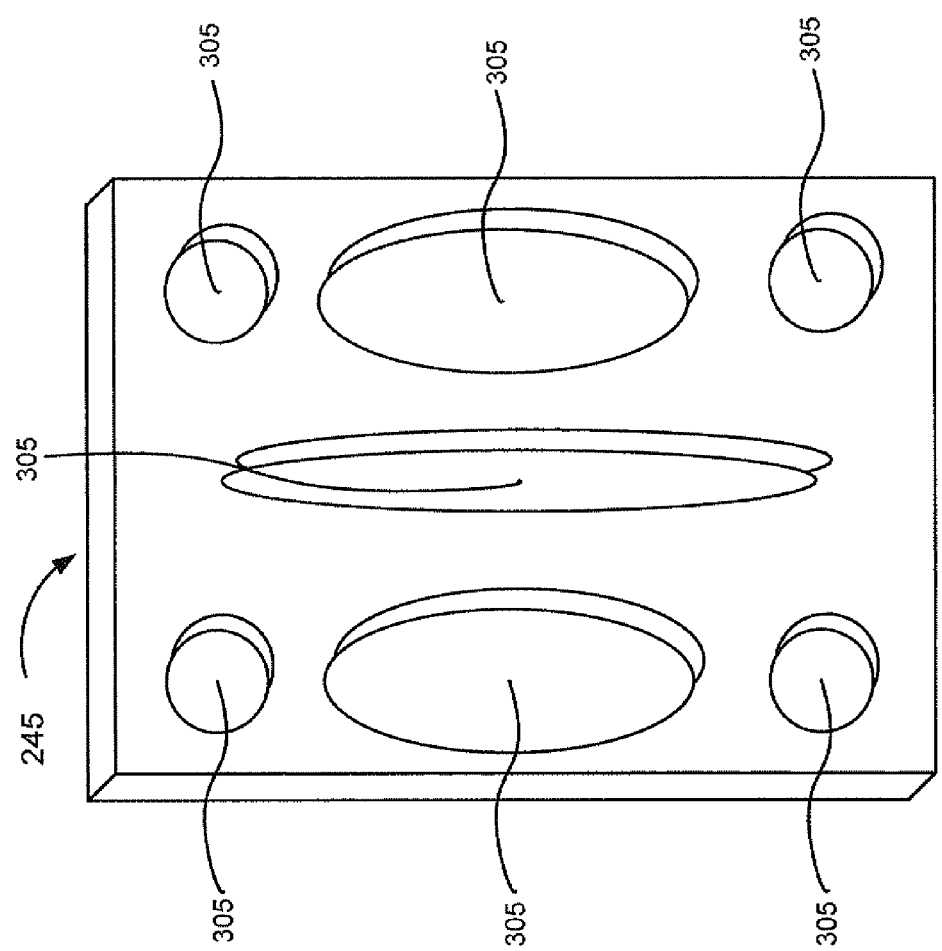
FIG. 3 is a diagram illustrating an exemplary baffle that may correspond to the baffle depicted in FIG. 2.

Baffles 245 may include a structure to regulate airflow within a device. For example, baffles 245 may be metal plates each having a calibrated perforation density to regulate airflow proximate to PCBs 235. For example, airflow may be regulated based on baffles 245 being positioned and oriented in such a way to create an obstruction to prevent high velocity airflow build-up and minimize re-circulating zones of airflow proximate to PCBs 235. As illustrated in FIG. 2, in one implementation, one baffle of baffles 245 may reside below PCBs 235 and another baffle of baffles 245 may reside above PCBs 235. Baffles 245 may be orthogonal to PCBs 235. FIG. 3 is a diagram illustrating an exemplary baffle 245. As illustrated, baffle 245 may include multiple holes 305 to regulate airflow. The size, shape, number, and arrangement of holes 305 depicted in FIG. 3 are exemplary. A perforation density associated with holes 305 may be calibrated.

For example, baffles 245 may include round holes whose diameters may be varied from 0.140" to 0.500" patterned in such a way to maximize the percentage of opening (e.g., 60% or more). In certain areas, such as connector area, where no airflow is required, the perforation may be ignored so that the airflow may be concentrated to other areas.

Fan tray assembly 250 may include a frame having a matrix of fans to cool device 200. As illustrated, in one implementation, fan tray assembly 250 may be proximate to side face 220. For example, fan tray assembly 250 may be orthogonal to PCBs 230. Fans of fan tray assembly 250 may pull air out and/or circulate air to cool device 200.

Although FIG. 2 illustrates an exemplary device 200, in other implementations fewer, additional, or different components may be utilized. For example, in other implementations, PCBs 230 could be in a rear compartment 209 of device 200 and PCBs 235 could be in a front compartment 207 of device 200. Additionally, or alternatively, fans of fan tray assembly 250 may push air to cool device 200.

Figure 4:
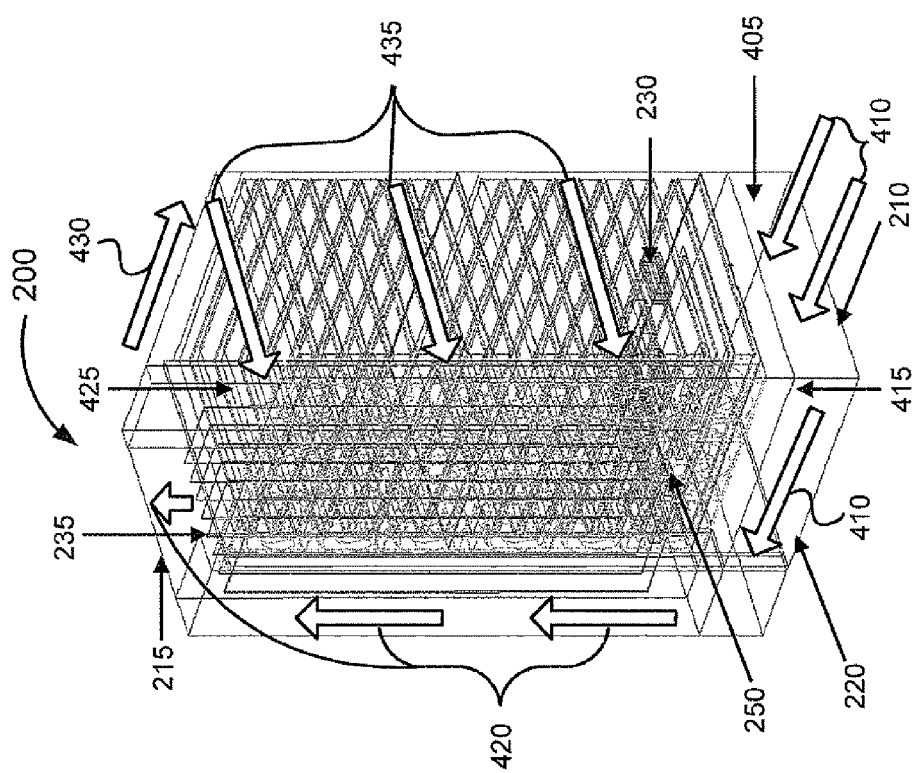
FIGS. 4 and 5 are diagrams illustrating exemplary airflow patterns associated with the concepts described herein.

FIG. 4 is a diagram illustrating an exemplary airflow pattern associated with the concepts described herein. In FIG. 4, device 200 is illustrated from a left side, frontal view. Airflows are illustrated by arrows that correspond to a direction of airflow. An airflow illustrated in FIG. 4 may be based on, for example, fan tray assembly 250, air pressure differences, chimney effect, etc.

As illustrated, airflow 410 may enter device 200 through an opening 405 of front face 210. For example, opening 405 may be a vented portion of device 200 to permit air to enter device 200. Airflow 410 may traverse along a bottom face 415 of device 200 toward rear face 215. Thereafter, airflow 410 may travel upward as airflow 420. As will be further illustrated and described in connection to FIG. 5, airflow 420 may travel through baffles 245 while cooling PCBs 235. Thereafter, airflow 430 may travel along a plenum existing between a top face 425 of device 200 and PCBs 230. Finally, airflow 435 may travel toward fan tray assembly 250 of side face 220 to exit device 200 while cooling PCBs 230.

Although FIG. 4 illustrates an exemplary airflow pattern, in other instances, the airflow pattern may include additional and/or different airflows.

Figure 5:
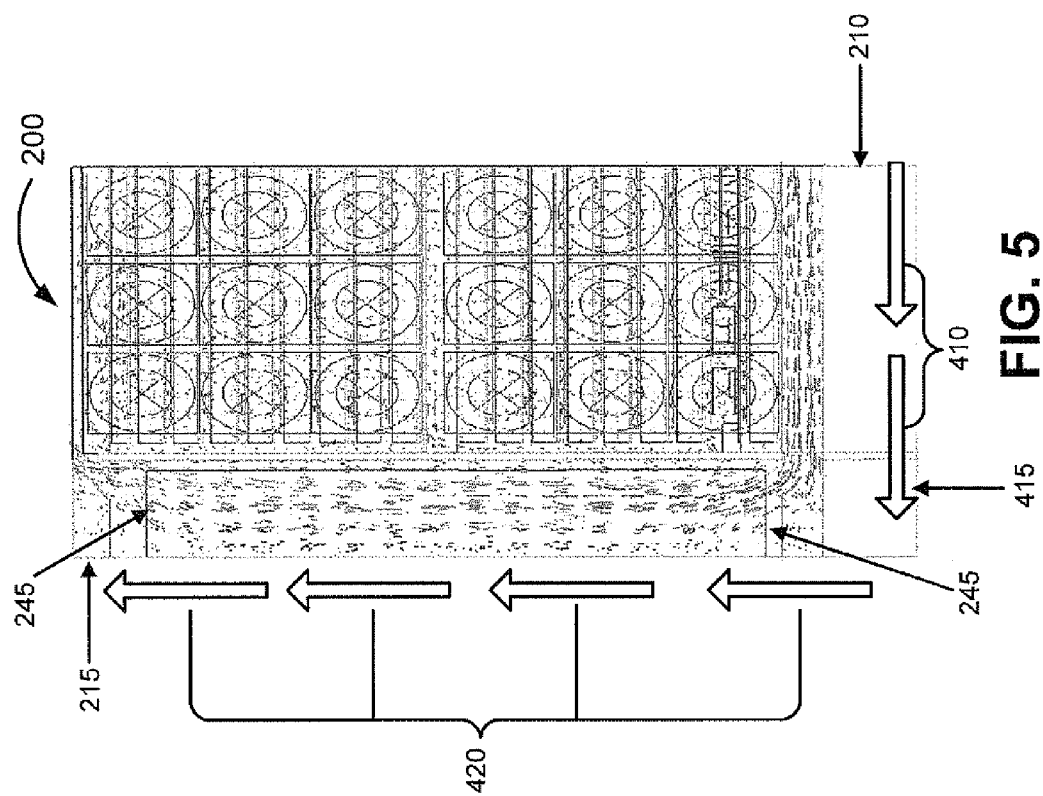

FIG. 5 is a diagram illustrating a partial airflow pattern from a perspective of side 220 that may correspond to the concepts described herein. As previously described, airflow 410 may enter from front face 210 of device 200 toward rear face 215. Airflow 420 may move upward through baffles 245 to cool PCBs 235. Based on baffles 245 and their respective perforation density, airflow 420 may be evenly distributed in the rear of device 200. For example, baffles 245 may regulate airflow 420 to minimize high velocity build-up and/or minimize a re-circulating zone that may have a low velocity epicenter.

Although FIG. 5 illustrates an exemplary airflow pattern, in other instances, the airflow pattern may include additional, and/or different airflows.

Figure 6:
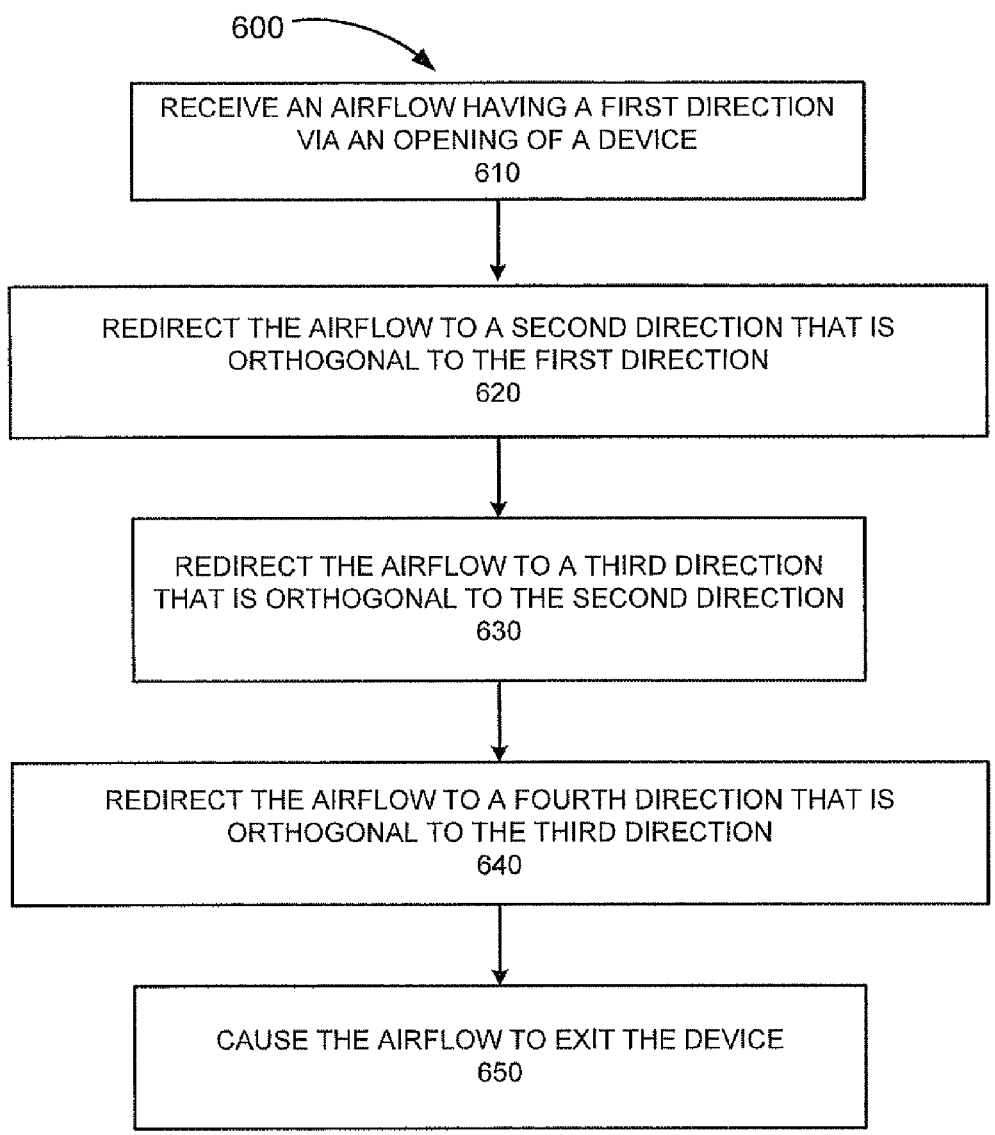
FIG. 6 is a flow diagram illustrating a process that may be associated with the concepts described herein.

FIG. 6 is a flow diagram illustrating a process that may be associated with the concepts described herein.

Process 600 may begin with an airflow having a first direction being received via an opening of a device (Block 610). For example, airflow 410 may be received via opening 405. Airflow 410 may travel in a first direction, such as a direction from front face 210 to rear face 215.

The airflow may be redirected to a second direction that is orthogonal to the first direction (block 620). For example, airflow 420 may be directed to a second direction that is orthogonal to the direction of airflow 410, as illustrated in FIGS. 4 and 5. The redirected airflow 420 may cool one or more electrical circuits of device 200, such as one or more electrical circuits having a first orientation. For example, airflow 420 may cool one or more electrical circuits, such as PCBs 235 that have a vertical orientation. In one implementation, airflow 420 may travel in the second direction via baffles 245. That is, baffles 245 may redirect airflow 420 upwards.

The airflow may be redirected to a third direction that is orthogonal to the second direction (block 630). For example, airflow 430 may be directed to a third direction that is orthogonal to the direction of airflow 420. For example, the third direction may correspond to a direction from rear face 215 to front face 210, as illustrated in FIG. 4.

The airflow may be redirected to a fourth direction that is orthogonal to the third direction (block 640). For example, airflow 435 may be directed to a fourth direction that is orthogonal to the direction of airflow 430, as illustrated in FIG. 4. The fourth direction may correspond to a direction from side face 225 to side face 220. The redirected airflow 435 may cool one or more electrical circuits of device 200, such as one or more electrical circuits that have a second orientation that is orthogonal to the first orientation. For example, airflow 435 may cool one or more electrical circuits, such as PCBs 230 that have a horizontal orientation.

In block 650, the airflow may then exit the device. For example, airflow 435 may exit device 200 via fan tray assembly 250 based on fan tray assembly pulling air from device 200. For example, fans of fan tray assembly 250 may pull air from device 200 in a direction corresponding to airflow 435.

Although FIG. 6 illustrates an exemplary process, in other instances, process 600 may include fewer, additional, and/or different operations. For example, the airflows described may travel differently if, for example, fan tray assembly 250 pushes air instead of pulling air. Additionally, or alternatively, the description of directions in relation to faces of device 200 may be different. For example, if PCBs 230 were in a rear compartment 209 of chassis 205 and PCBs 235 were in a front compartment 207 of chassis 205, airflow 410 may travel in a direction from rear face 215 to front face 210, and the remaining airflows may travel in a manner corresponding to that described above.

CONCLUSION

The foregoing description of implementations provides an illustration, but is not intended to be exhaustive or to limit the implementations to the precise form disclosed. Modifications and variations are possible in light of the above teachings or may be acquired from practice of the teachings.

In addition, while a series of blocks has been described with regard to the process illustrated in FIG. 6, the order of the blocks may be modified in other implementations. Further, non-dependent blocks may be performed in parallel. Further, it may be possible to omit blocks within the process of FIG. 6.

Even though particular combination of features are recited in the claims and/or disclosed in the specification, these combinations are not intended to limit the invention. In fact, many of these features may be combined in ways not specifically recited in the claims and/or disclosed in the specification.

No element, block, or instruction used in the present application should be construed as critical or essential to the implementations described herein unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A chassis, comprising:
   a front section that contains a first electronic circuit board oriented in a first plane;
   a rear section that contains a second electronic circuit board oriented in a second plane, where the first plane and the second plane are substantially orthogonal;
   a midplane dividing the front and the rear sections; and
   a fan tray assembly including a plurality of fans to:
   provide a first portion of an airflow, having a first direction, from which a second portion of the airflow, having a second direction that is orthogonal to the first direction, is provided,
   cool, using the second portion of the airflow, the first electronic circuit board of the front section,
   provide, from the second portion of the airflow, a third portion of the airflow having a third direction that is orthogonal to the second direction, where the third direction is opposite the first direction,
   provide, from the third portion of the airflow, a fourth portion of the airflow having a fourth direction that is orthogonal to the first direction, the second direction, and the third direction, and cool, using the fourth portion of the airflow, the second electronic circuit board of the rear section, where the fan tray assembly is oriented on a third plane that is substantially parallel to the second plane.

2. The chassis of claim 1, where the first plane is oriented horizontally and the second plane is oriented vertically, and the third plane is substantially orthogonal to the first plane.

3. The chassis of claim 2, where the fan tray assembly pulls the airflow to cool the front section and exhausts the airflow from the chassis.

4. The chassis of claim 1, further comprising:
   a baffle including perforations to regulate one or more of the portions of the airflow.

5. The chassis of claim 4, where the rear section contains the baffle and the baffle is oriented substantially orthogonal to the second electronic circuit board.

6. The chassis of claim 5, where the baffle includes a plurality of baffles, the plurality of baffles includes a first baffle located above the second electronic circuit board and a second baffle located below the second electronic circuit board.

7. The chassis of claim 1, where the fan tray assembly cools the first electronic circuit board by pulling the second portion of the airflow in a direction parallel to the first plane.

8. The chassis of claim 1, where the fan tray assembly is oriented on the third plane of the front section.

9. A method for cooling a device having a midplane, the method comprising:
   directing a first portion of an airflow, having a first direction, to provide a second portion of the airflow having a second direction, the second direction being orthogonal to the first direction;
   cooling, via the second portion of the airflow, a first electronic circuit board of the device, the first electronic circuit board being orthogonal to the midplane;
   redirecting the second portion of the airflow to provide a third portion of the airflow having a third direction, the third direction being orthogonal to the second direction;
   redirecting the third portion of the airflow to provide a fourth portion of the airflow having a fourth direction; and
   cooling, via the fourth portion of the airflow, a second electronic circuit board of the device, the second electronic board being orthogonal to the first electronic circuit board, where the first direction and the third direction are opposite directions, and the fourth direction is orthogonal to the first direction, the second direction, and the third direction.

10. The method of claim 9, where the directing comprises:
    directing the second portion of the airflow via a first baffle.

11. The method of claim 10, where the directing further comprises:

directing the second portion of the airflow via a second baffle.

12. The method of claim 9, further comprising:
pulling the fourth portion of the airflow from the device using a fan tray assembly; and
causing the fourth portion of the airflow to exit the device.

13. The method of claim 9, further comprising:
receiving the first portion of the airflow via an opening located below the midplane.

14. The method of claim 9, where the redirecting the second portion of the airflow:
redirecting the second portion of the airflow at a location that is above the midplane.

15. A device, comprising:
a first plurality of circuit boards oriented in a horizontal direction;
a second plurality of circuit boards oriented in a vertical direction;
a vertically oriented midplane providing a connection between one or more circuit boards of the first plurality of circuit boards and one or more circuit boards of the second plurality of circuit boards; and
a fan system, oriented on a plane that is parallel to the second plurality of circuit boards, to:
provide a first portion of an airflow, having a first direction, from which a second portion of the airflow, having a second direction that is orthogonal to the first direction, is provided,
cool, using the second portion of the airflow, the first plurality of circuit boards,
provide, from the second portion of the airflow, a third portion of the airflow having a third direction that is orthogonal to the second direction, where the third direction is opposite the first direction,
provide, from the third portion of the airflow, a fourth portion of the airflow having a fourth direction that is orthogonal to the first direction, the second direction, and the third direction, and
cool, using the fourth portion of the airflow, the second plurality of circuit boards.

16. The device of claim 15, further comprising:
a first baffle; and
a second baffle, where the first baffle and the second baffle include one or more perforations to regulate at least the fourth portion of the airflow.

17. The device of claim 16, where the first baffle is parallel to the second baffle.

18. A device, comprising:
a midplane connecting a first circuit board oriented orthogonal to a second circuit board;
a chassis; and
a cooling mechanism oriented on a plane corresponding to a side of the chassis, where the cooling mechanism pulls air to:
provide a first portion of an airflow, having a first direction, from which a second portion of the airflow, having a second direction that is orthogonal to the first direction, is provided,
cool, using the second portion of the airflow, the first circuit board,
provide, from the second portion of the airflow, a third portion of the airflow having a third direction that is orthogonal to the second direction, where the third direction is opposite the first direction,
provide, from the third portion of the airflow, a fourth portion of the airflow having a fourth direction that is orthogonal to the first direction, the second direction, and the third direction, and
cool, using the fourth portion of the airflow, the second circuit board, the plane being substantially parallel to the second circuit board.

19. The device of claim 18, where the chassis is compartmentalized into a front section and a rear section, and the cooling mechanism is oriented on the plane corresponding to the side of the chassis of the front section.

* * * * *